(12) United States Patent
Hirler et al.

(10) Patent No.: US 7,414,286 B2
(45) Date of Patent: Aug. 19, 2008

(54) TRENCH TRANSISTOR AND METHOD FOR FABRICATING A TRENCH TRANSISTOR

(75) Inventors: Franz Hirler, Isen (DE); Martin Poelzl, Ossiach (AT); Markus Zundel, Egmating (DE); Rudolf Zelsacher, Klagenfurt (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/513,969

(22) Filed: Aug. 31, 2006

(65) Prior Publication Data

US 2007/0114600 A1    May 24, 2007

(30) Foreign Application Priority Data

Aug. 31, 2005  (DE) ................ 10 2005 041 256

(51) Int. Cl.
*H01L 29/94* (2006.01)
(52) U.S. Cl. ...................... 257/328; 257/330
(58) Field of Classification Search .......... 257/E29.118, 257/328, 330
See application file for complete search history.

(56) References Cited

U.S. PATENT DOCUMENTS

2005/0167742 A1    8/2005  Challa et al.
2006/0214221 A1*   9/2006  Challa et al. ................ 257/328

FOREIGN PATENT DOCUMENTS

| DE | 102 97 349 | 1/2005 |
| DE | 103 39 455 | 5/2005 |
| WO | WO 2005/053032 | 6/2005 |

* cited by examiner

*Primary Examiner*—Douglas M Menz
(74) *Attorney, Agent, or Firm*—Dicke, Billig & Czaja, PLLC (57) ABSTRACT

A trench transistor having a semiconductor body, in which a trench structure and an electrode structure embedded in the trench structure is disclosed. The electrode structure is electrically insulated from the semiconductor body by an insulation structure. The electrode structure has a gate electrode structure and a field electrode structure arranged below the gate electrode structure and electrically insulated from the latter. There is provided between the gate electrode structure and the field electrode structure a shielding structure for reducing the capacitive coupling between the gate electrode structure and the field electrode structure.

15 Claims, 14 Drawing Sheets

Removal of TEOS, optionally CMP before etching

TRENCH TRANSISTOR AND METHOD FOR FABRICATING A TRENCH TRANSISTOR

CROSS-REFERENCE TO RELATED APPLICATIONS

This Utility Patent Application claims priority to German Patent Application No. DE 10 2005 041 256.4, filed on Aug. 31, 2005 which is incorporated herein by reference.

BACKGROUND

One aspect of the invention relates to a trench transistor and to a method for fabricating a trench transistor.

Trench transistors have a semiconductor body, in which a trench structure and an electrode structure embedded in the trench structure are provided. The electrode structure is electrically insulated from the semiconductor body by means of an insulation structure. In the case of a field plate trench transistor, the electrode structure is divided into a gate electrode structure and a field electrode structure arranged below the gate electrode structure, in which case the field electrode structure may be electrically insulated from the gate electrode structure.

It is always an aim to further increase the integration density of the trench transistors. This may be effected, on the one hand, by reducing the distances between the individual trenches of the trench structure (that is to say that the width of that part of the semiconductor body which is situated between the trenches ("mesa zones") is reduced). On the other hand, the width of the trenches themselves may be reduced. If use is made of the second possibility, that is to say that the width of the trenches is reduced, then it is generally necessary likewise to reduce the thickness of the insulation structure which electrically insulates the field electrode structure from the semiconductor body (since the reduction of the insulation structure thickness has a great "miniaturization potential"). This is problematic, however, since, in the case of excessively thin insulation layers between the field electrode structure and the semiconductor body, particularly in the case of fast switching operations, strong capacitive coupling effects occur between the drain/drift region of the trench transistor and the gate electrode structure (coupling of drain/drift region—field electrode structure—gate electrode structure) if the field electrode structure is electrically insulated from the gate electrode structure.

SUMMARY

One aspect of the invention specifies a trench transistor which has an increased degree of miniaturization compared with the prior art, but at the same time avoids such coupling effects.

The trench transistor according to one embodiment of the invention has a semiconductor body, in which a trench structure and an electrode structure embedded in the trench structure are provided. The electrode structure is electrically insulated from the semiconductor body by an insulation structure. The electrode structure has a gate electrode structure and a field electrode structure arranged below the gate electrode structure and electrically insulated from the latter. There is provided between the gate electrode structure and the field electrode structure a shielding structure for reducing the capacitive coupling between the gate electrode structure and the field electrode structure. The shielding structure accordingly serves for reducing electromagnetic or electrostatic coupling effects between the gate electrode structure and the field electrode structure.

The use of a shielding structure has the effect that even in the case of a high degree of integration, that is to say in the case of a small trench width, coupling effects between the gate electrode structure and the field electrode structure can be kept small.

The shielding structure may be configured in a wide variety of ways. By way of example, it is possible to configure the shielding structure as a shielding electrode which is at a fixed potential and which is electrically insulated from the gate electrode structure, the field electrode structure and the semiconductor body. The shielding electrode is preferably at source potential, but may also be at any other potential.

If the shielding structure is realized as a shielding electrode, then the sum of the internal resistances of the shielding electrode and the current/voltage supply of the shielding electrode should be less than corresponding internal resistance sums for the gate electrode structure and the field electrode structure. This has the advantage that the shielding electrode scarcely couples to rapidly changing drain potentials or space charge zone potentials, whereby a good shielding effect is ensured.

The shielding structure may also be realized by a shielding insulation layer, the thickness of which is greater than the thickness of the insulation structure region which insulates the field electrode structure from the semiconductor body. As an alternative, the thickness of the shielding insulation layer may turn out to be greater than double the thickness of the insulation structure region which insulates the gate electrode structure from the semiconductor body, or may turn out to be greater than double the thickness of the insulation structure region which insulates the field electrode structure from the semiconductor body.

The shielding insulation layer may be formed as a layer sequence having a first oxide layer, a nitride layer and a second oxide layer.

If the shielding structure is realized in the form of a shielding insulation layer, then, in one embodiment, the k value of the shielding insulation layer is less than the k value of the insulation structure. By means of the low k value it is possible, in a manner similar to that in the case of the shielding electrode, to achieve a significant reduction of the capacitive coupling between the gate electrode structure and the field electrode structure.

In a further embodiment, the shielding structure is realized in the form of a cavity.

The horizontal distances between the shielding structure and the semiconductor body may, in order to improve the shielding effect, turn out to be less than the horizontal distances between the gate electrode structure and the semiconductor body.

One aspect of the invention furthermore provides a method for producing the trench transistor described above. The method proceeds from a preprocessed semiconductor body, in which a trench structure and a field electrode structure embedded in the trench structure are provided, the field electrode structure being electrically insulated from the semiconductor body by a field electrode insulation structure. The method is characterized by the following processes: firstly, insulating material is deposited on the field electrode structure. A gate electrode insulation structure is then formed. Finally, a gate electrode structure is formed.

The method according to one embodiment of the invention is suitable for the fabrication of a trench transistor whose shielding structure is realized in the form of a shielding insulation layer. The method according to the invention makes it possible to set the thickness of the deposited insulating material as desired, whereby the intensity of the shielding effect can likewise be set as desired.

The process of depositing insulating material preferably includes the following process of: forming a protective oxide layer on the semiconductor body, forming a silicon nitride or polysilicon layer on the protective oxide layer, filling the remaining free spaces in the trench structure with insulating material, and etching back the resulting layer composite having protective oxide layer, silicon nitride or polysilicon layer and the insulating material into the trench structure as far as a specific depth, so that the insulating material has a desired thickness.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the figures, identical or mutually corresponding regions, components or component groups are identified by the same reference numerals. Furthermore, the doping types of all embodiments may be configured inversely, that is to say that n-type zones can be replaced by p-type zones, and vice versa.

Figure 1:
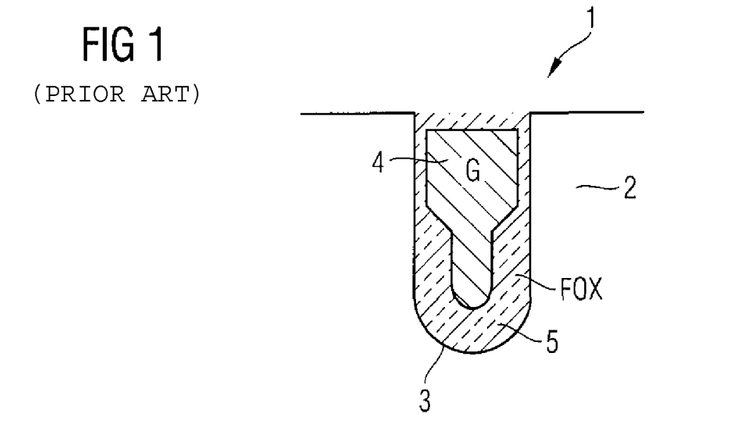
FIG. 1 illustrates a detail from a conventional trench transistor in cross-sectional illustration.

FIG. 1 illustrates a detail from a trench transistor 1 having a semiconductor body 2, in which a trench structure 3 is formed (only one trench of the trench structure 3 can be seen in FIG. 1). An electrode structure is provided in the trench structure 3, said electrode structure being electrically insulated from the semiconductor body 2 by an insulation structure 5. Electric currents running vertically in the semiconductor body 2 can be generated and controlled by means of the electrode structure 4. The entire electrode structure 4 is at gate potential. This has the disadvantage that a high gate-drain capacitance occurs between the electrode structure 4 and the drift zone/drain zone situated below the trench structure 3 and alongside the trench structure 3, which leads to high switching losses.

Figure 2:
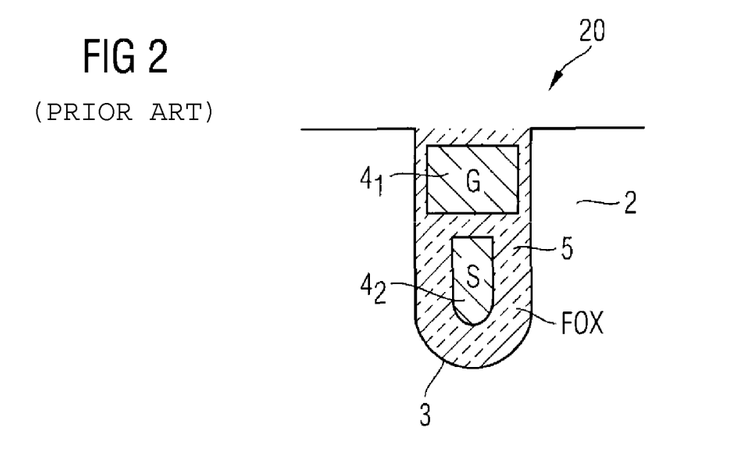
FIG. 2 illustrates a detail from a conventional trench transistor in cross-sectional illustration.

In order to combat this problem, it is known, as is illustrated in FIG. 2, to divide the electrode structure 4 into a gate electrode structure part $4_1$ and a field electrode structure part $4_2$. In this case, the field electrode structure part $4_2$ is at source potential and the gate electrode structure part $4_1$ is at gate potential. This division makes it possible to bring about a noticeable reduction of the gate-drain capacitance.

Figure 3:
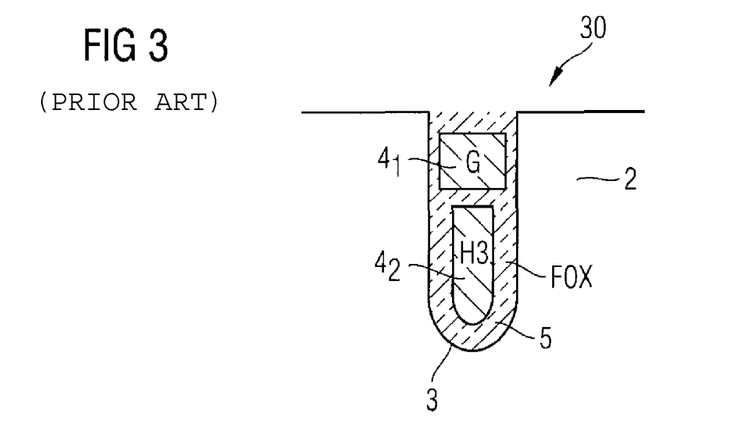
FIG. 3 illustrates a detail from a conventional trench transistor in cross-sectional illustration.

If, as is illustrated in FIG. 3, the width of the trenches of the trench structure 3 is to be reduced, the thickness of the insulation structure 5 has to be greatly reduced. The consequence of this, however, is that there is a high capacitive coupling between the field electrode structure part $4_2$ and the drain zone/drift zone present below/alongside the trench structure 3 in the semiconductor body 2. Fluctuations in the drain potential are thus transferred to a very great extent to the potential of the field electrode structure part $4_2$. The resulting potential fluctuations in the field electrode structure part $4_2$ are in turn transferred to a great extent to the potential prevailing at the gate electrode structure part $4_1$, which is undesirable.

Figure 4:
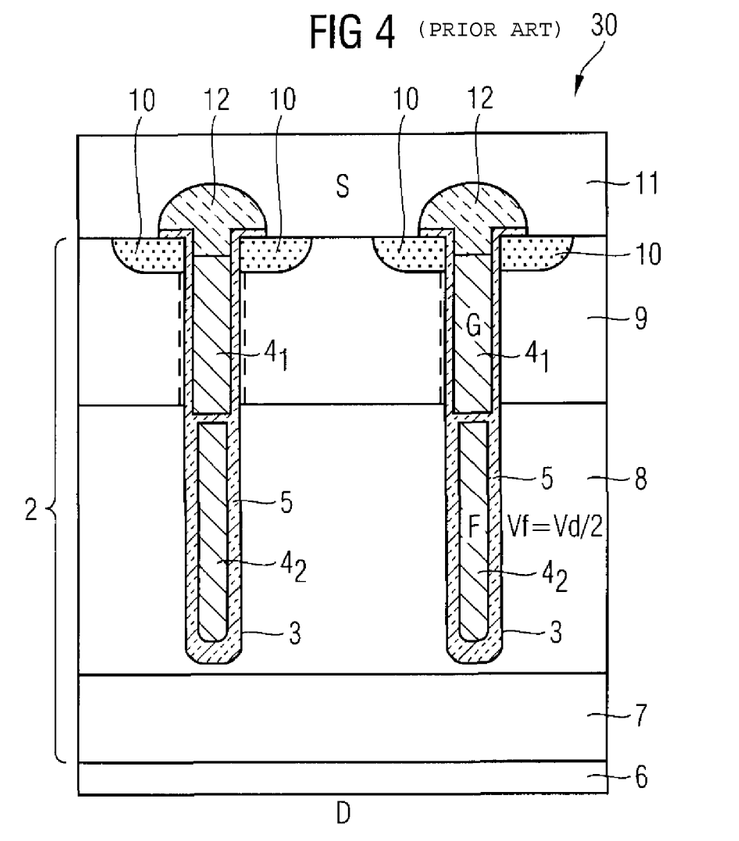
FIG. 4 illustrates an enlarged detail from the trench transistor illustrated in FIG. 3, in cross-sectional illustration.

FIG. 4 reveals a more detailed version of the trench transistor 30 illustrated in FIG. 3. The trench transistor 30 has a drain contact (for example metal contact) 6, on which a semiconductor body 2 is provided. A drain zone 7, a drift zone 8 and a body zone 9 are formed within the semiconductor body 2. A trench structure 3 is provided in the semiconductor body 2, a gate electrode structure part $4_1$ and a field electrode structure part $4_2$ being embedded in said trench structure. The gate electrode structure part $4_1$ and the field electrode structure part $4_2$ are electrically insulated from the semiconductor body 2 by an insulation structure 5 (which is configured in thickened fashion in the lower region of the trench structure 3 (field oxide) and is configured in thinned fashion in the upper region (gate oxide)). Source zones 10 are formed in the body zone 9. The source zones 10 and the body zone 9 are contact-connected by means of a source contact 11, the gate electrode structure part $4_1$ being electrically insulated from the source contact 11 by an insulation structure 12.

Figure 5:
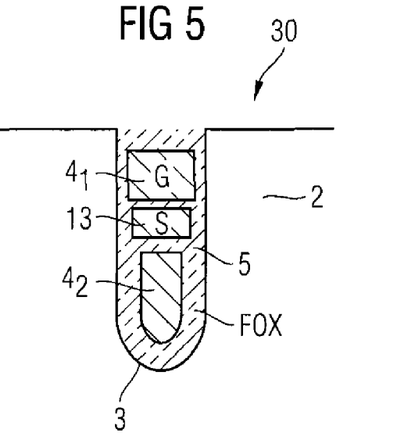
FIG. 5 illustrates a detail from a first embodiment of the trench transistor according to the invention, in cross-sectional illustration.

FIG. 5 illustrates a first embodiment 40 of the trench transistor according to the invention. This embodiment differs from the embodiment illustrated in FIG. 3 and in FIG. 4 merely by the fact that a shielding electrode 13 at a fixed potential (here: source potential) is provided between the gate electrode structure part $4_1$ and the field electrode structure part $4_2$. A more detailed representation of the embodiment 40 can be seen in FIG. 6. The potential of the field electrode structure part $4_2$ may be at a fixed value or be a floating potential. Furthermore, it is possible to put different parts of the field electrode structure part $4_2$ (designated here by H1, H2 and H3) at respectively different potentials. The potential of the shielding electrode 13 is preferably at source potential and the potential of the gate electrode structure part $4_1$ is at gate potential. In one embodiment, the sum of the internal resistances of the shielding electrode 13 and the current/voltage supply of the shielding electrode 13 is less than corresponding internal resistance sums for the gate electrode structure part $4_1$ and the field electrode structure part $4_2$.

Figure 6:
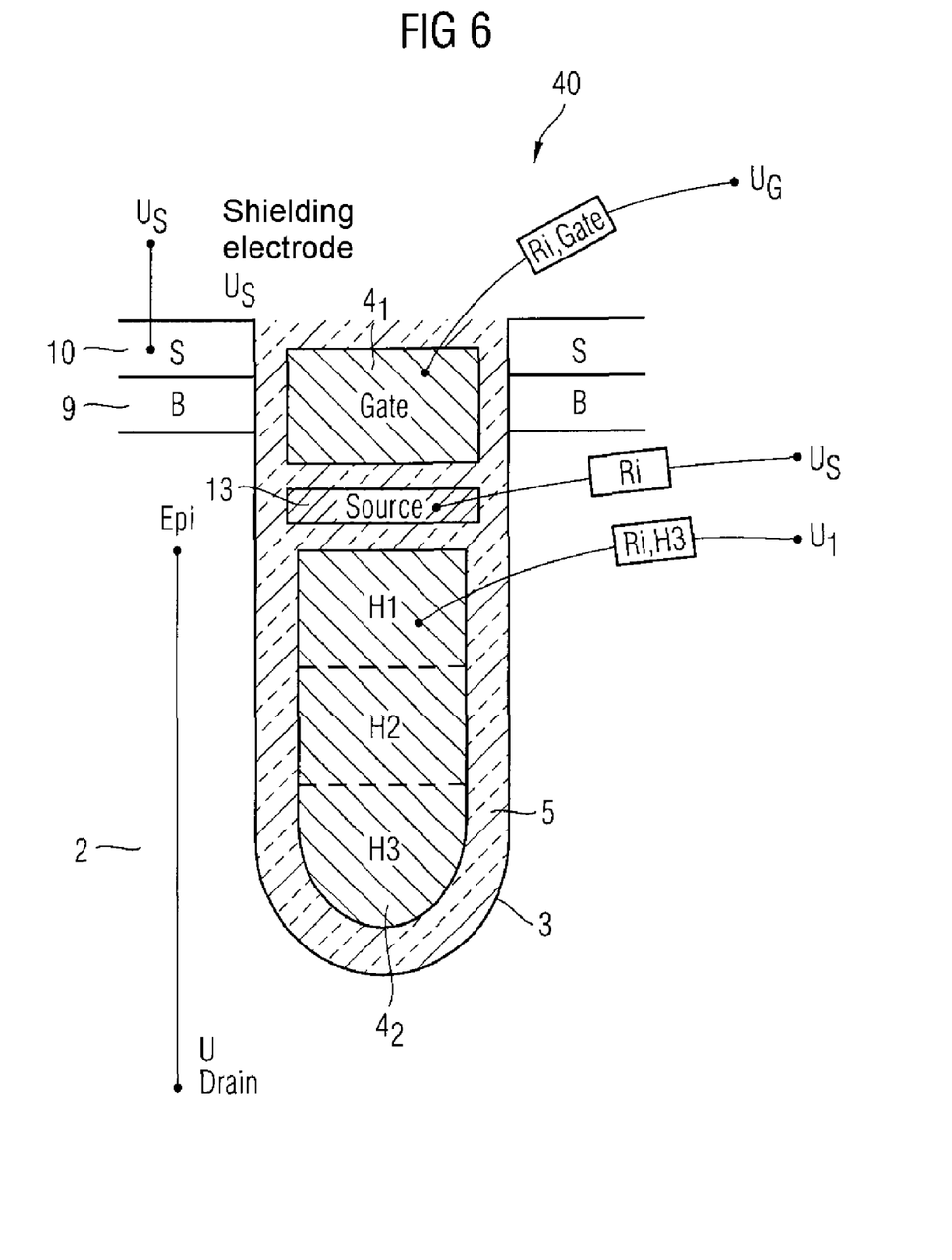
FIG. 6 illustrates a detail from a second embodiment of the trench transistor according to the invention, in cross-sectional illustration.
Figure 7:
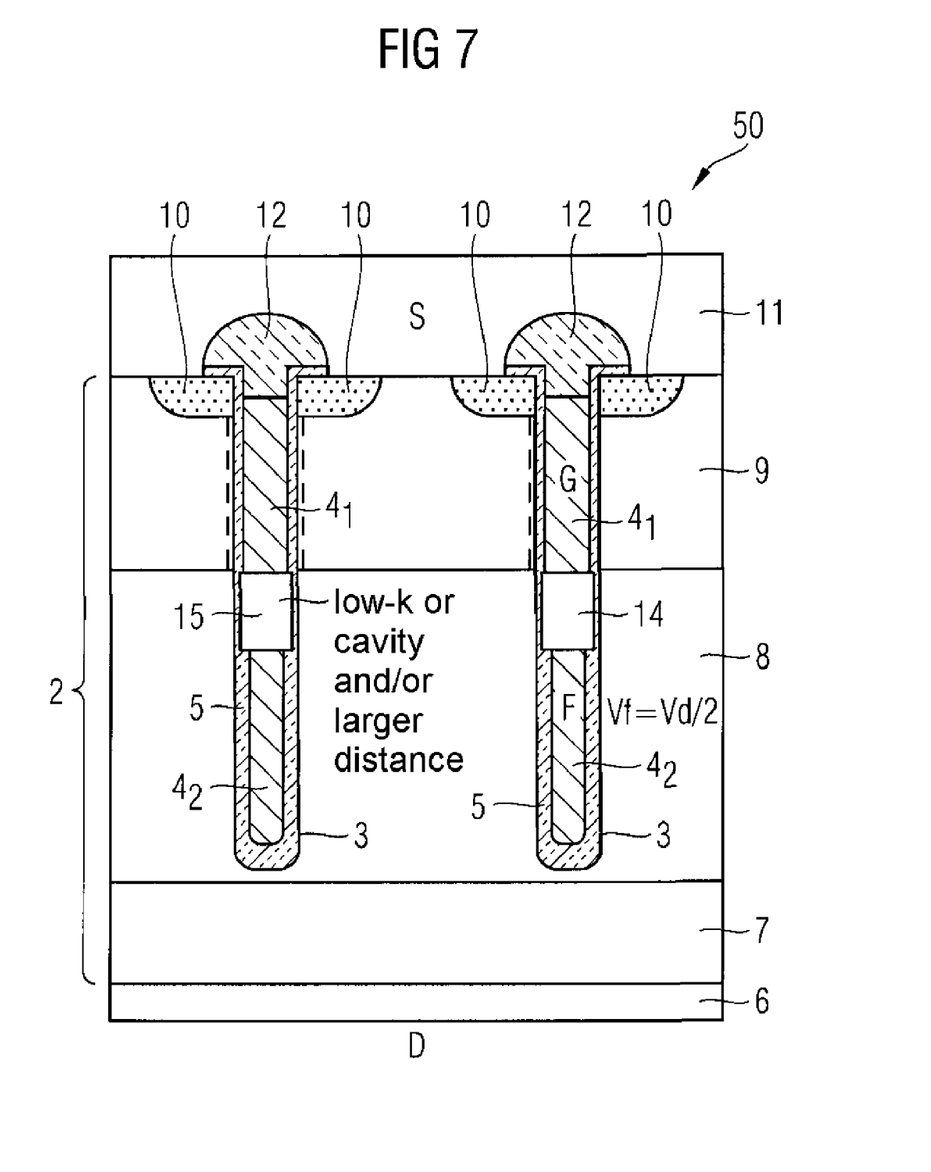
FIG. 7 illustrates a detail from a first embodiment of the trench transistor according to the invention, in cross-sectional illustration.

FIG. 7 illustrates a further embodiment 50 of the trench transistor according to the invention. This embodiment differs from the embodiment 40 illustrated in FIG. 6 merely by the fact that the shielding electrode 13 is replaced by a cavity 14 adjoined by the upper end of the field electrode structure part $4_2$ and the lower end of the gate electrode structure part $4_1$. As an alternative, the shielding electrode 13 is replaced by an insulation layer 15 having a low k value and/or a large vertical extent. Each of the alternatives mentioned makes it possible to reduce the coupling between the gate electrode structure part $4_1$ and the field electrode structure part $4_2$.

The description below describes, with reference to FIGS. 8A to 8J, a method for fabricating the insulation layer 15 or a method for fabricating a trench transistor containing an insulation layer of this type. In all of the figures, the left-hand part illustrates a cross-sectional illustration and the right-hand part illustrates a longitudinal section illustration corresponding thereto.

Figure 8A:
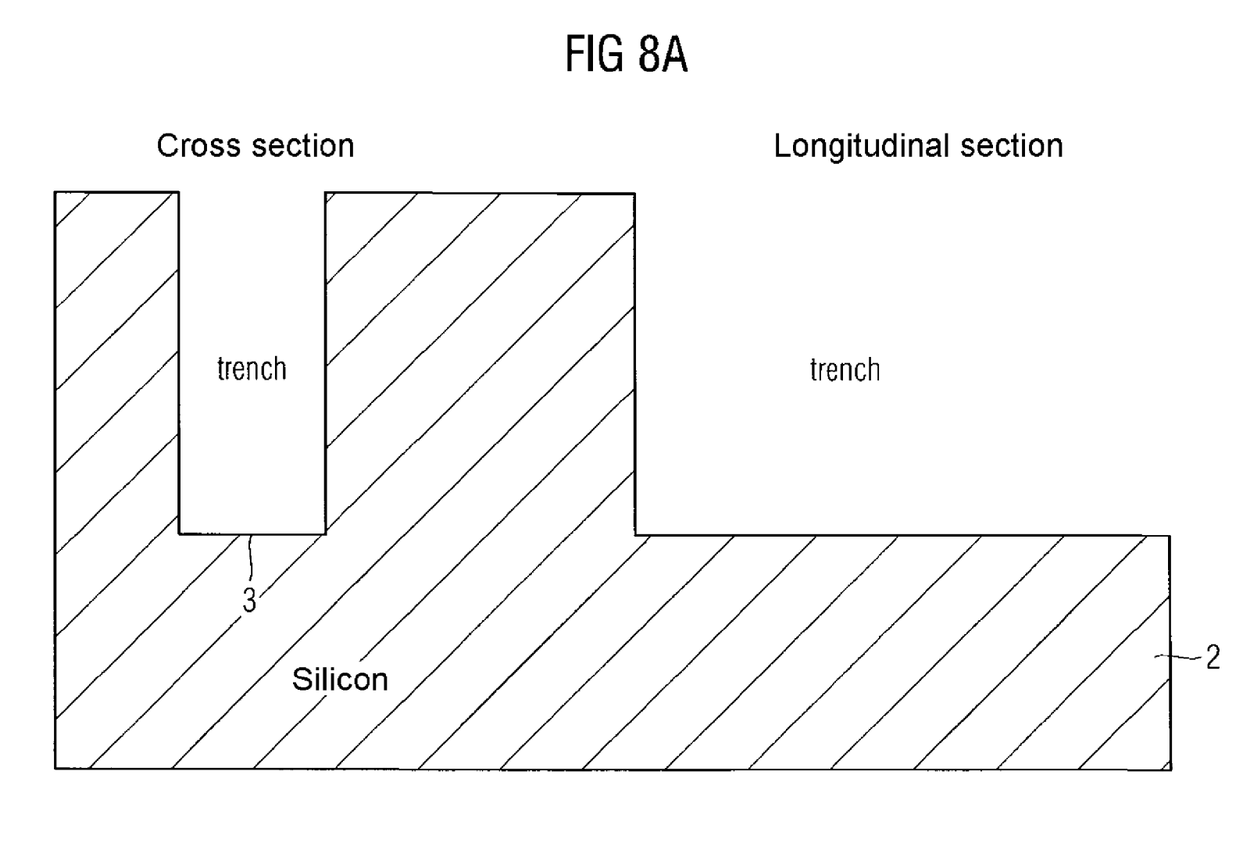
FIGS. 8A to 8J illustrate a first to tenth process of a embodiment of the fabrication method according to the invention.
Figure 8B:
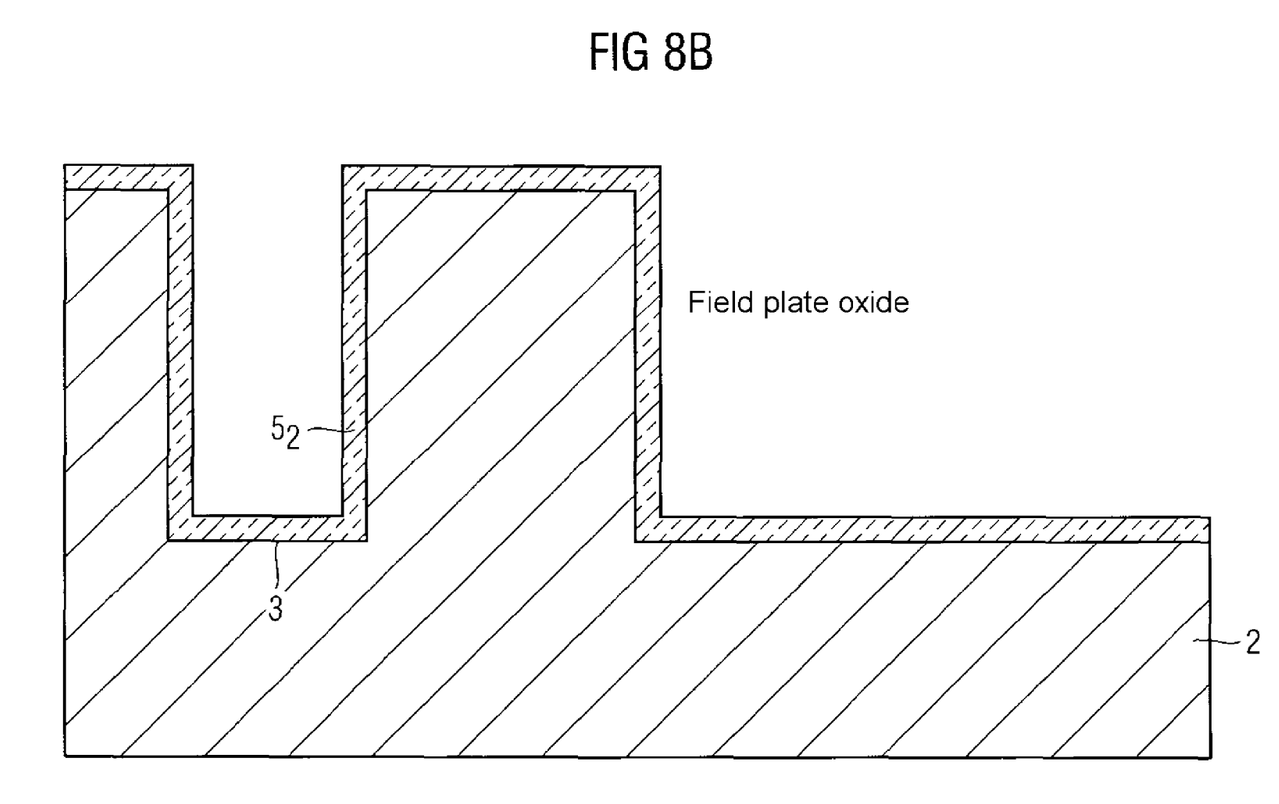
Figure 8C:
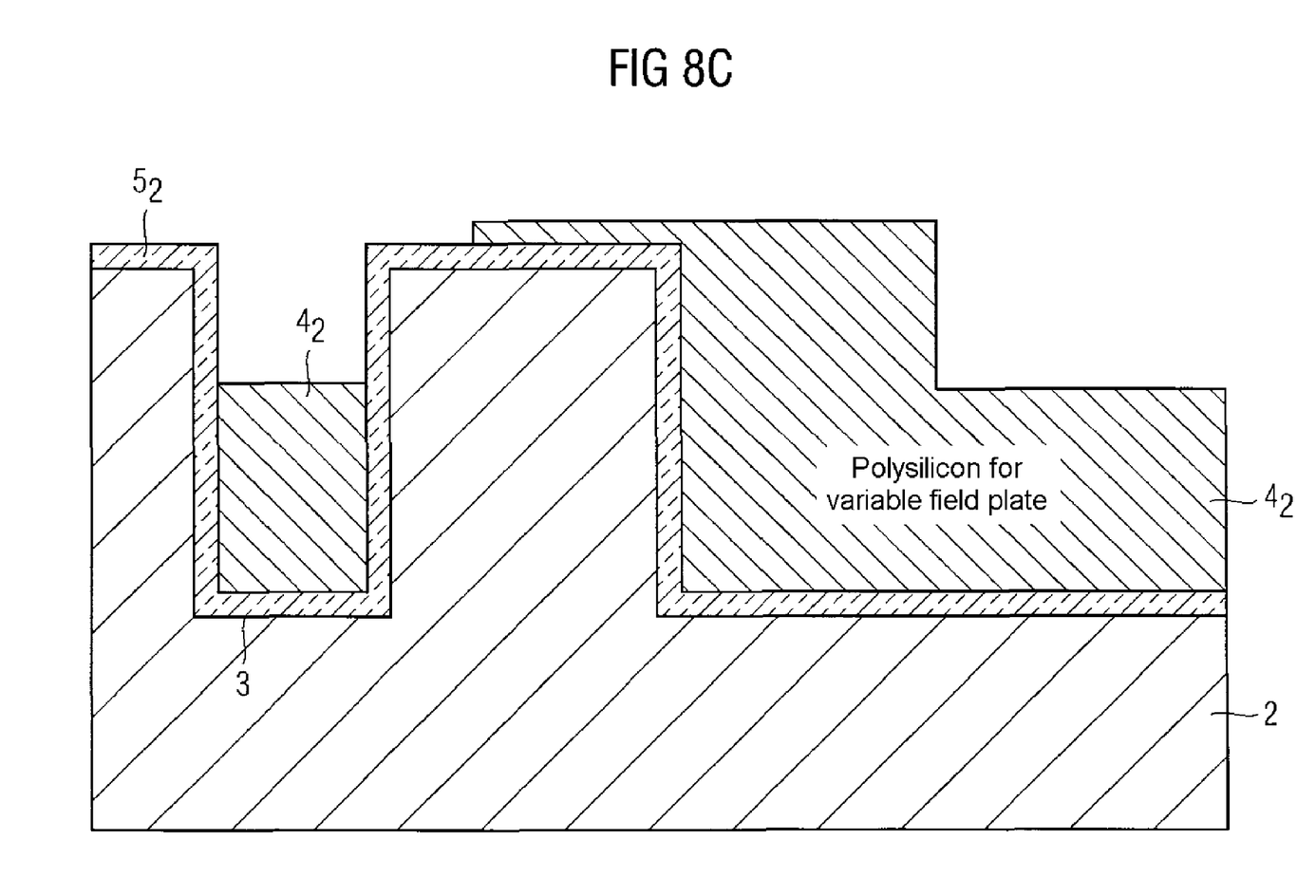
Figure 8D:
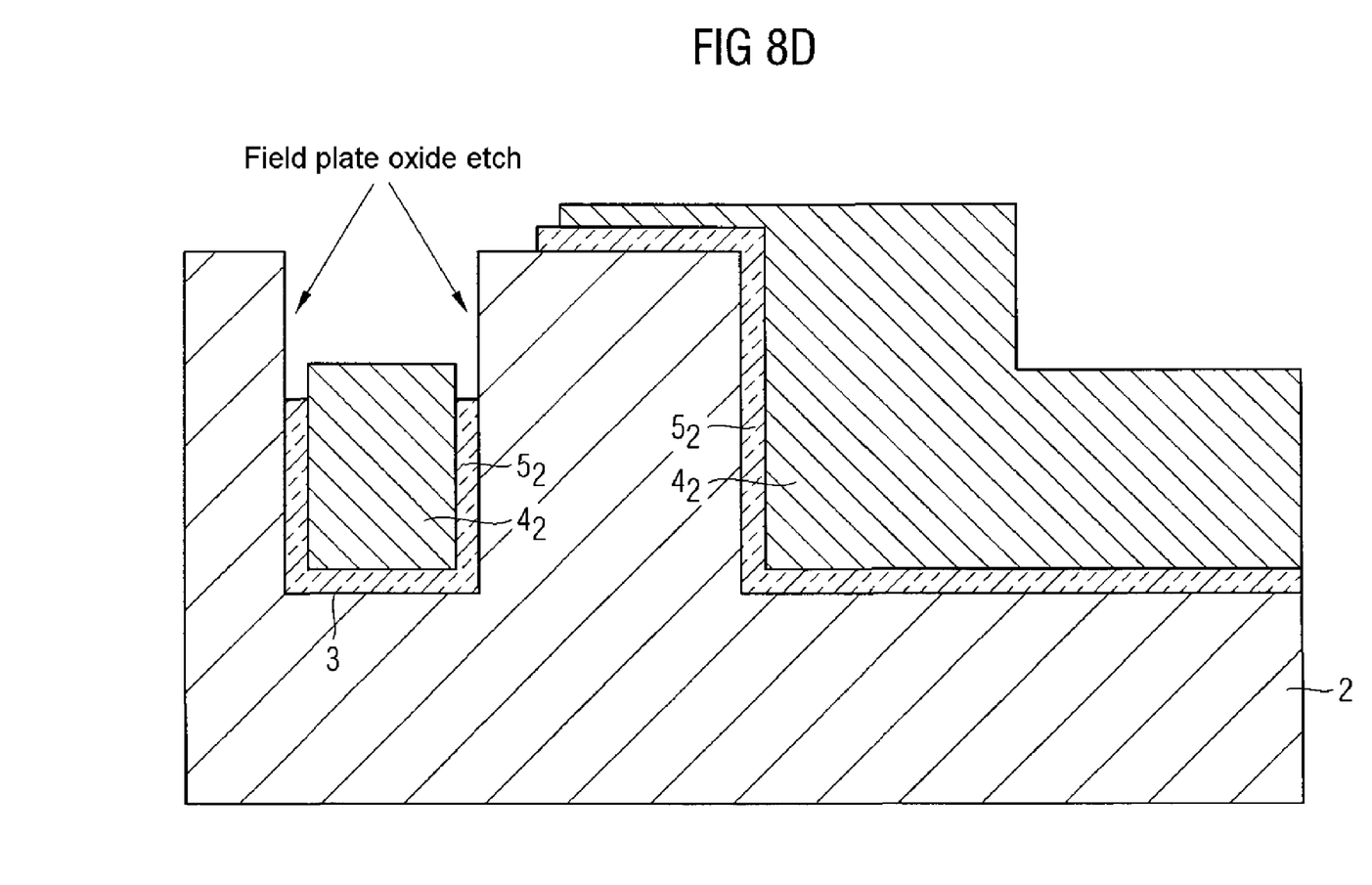
Figure 8E:
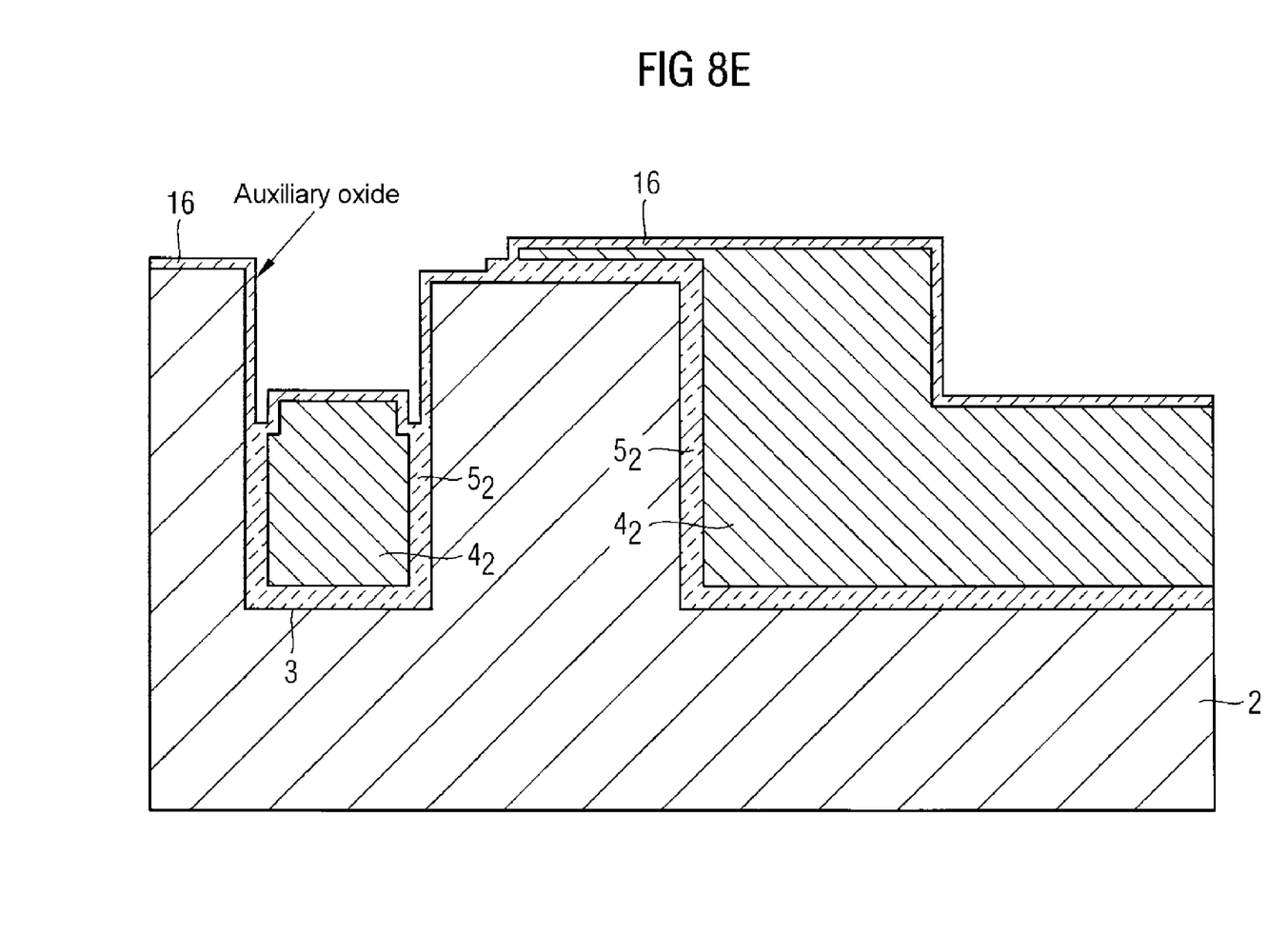
Figure 8F:
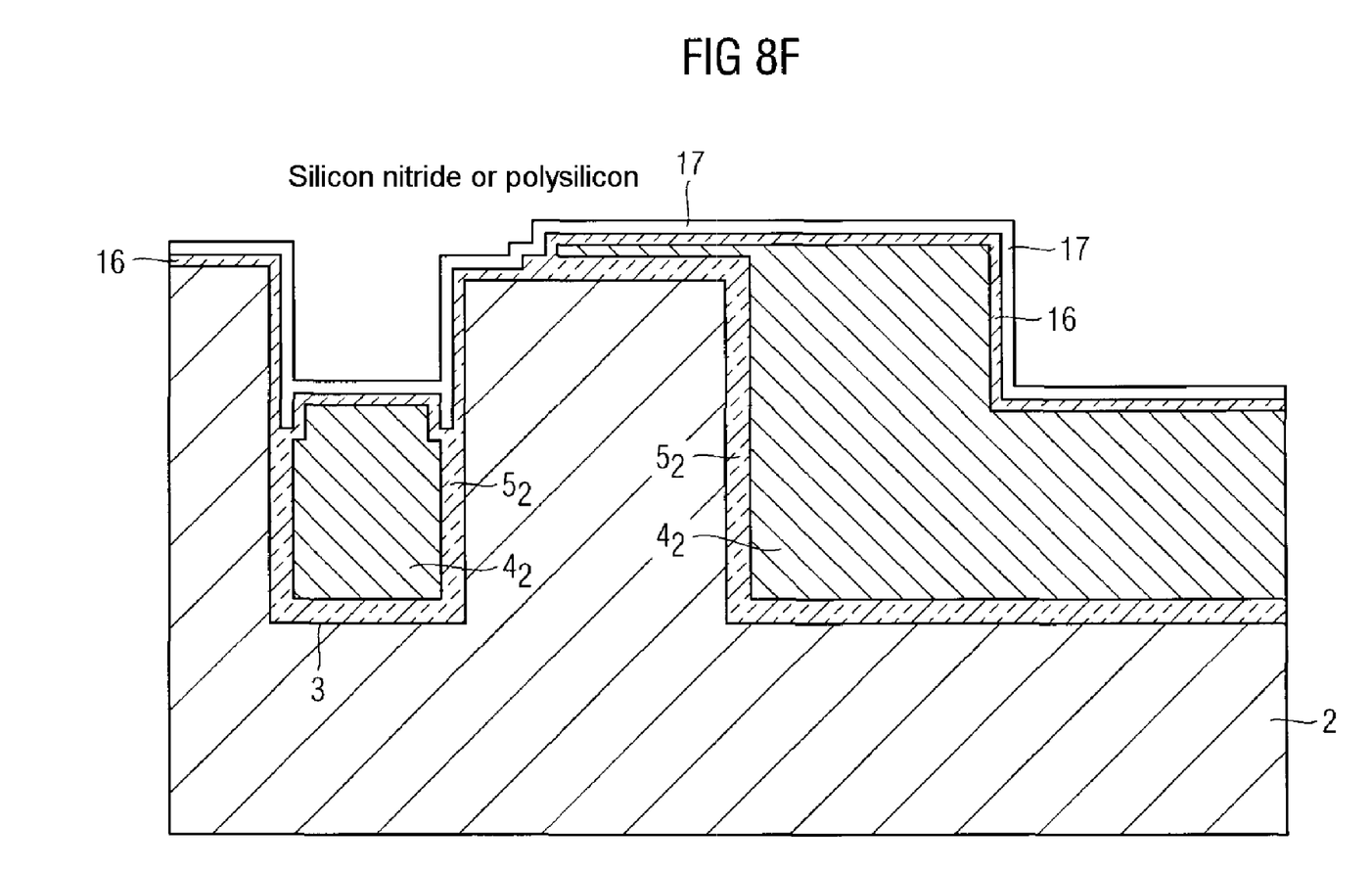
Figure 8G:
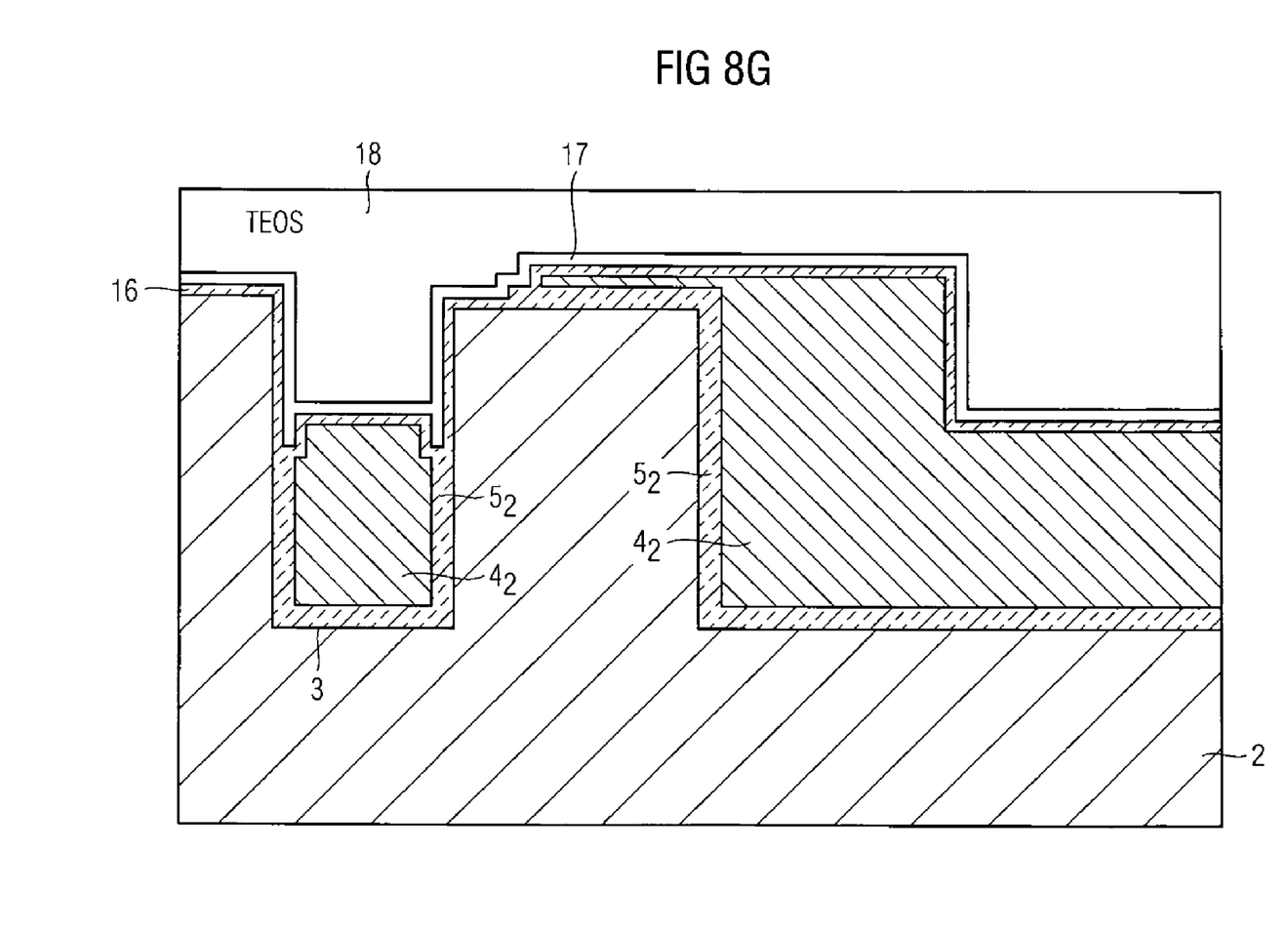
Figure 8H:
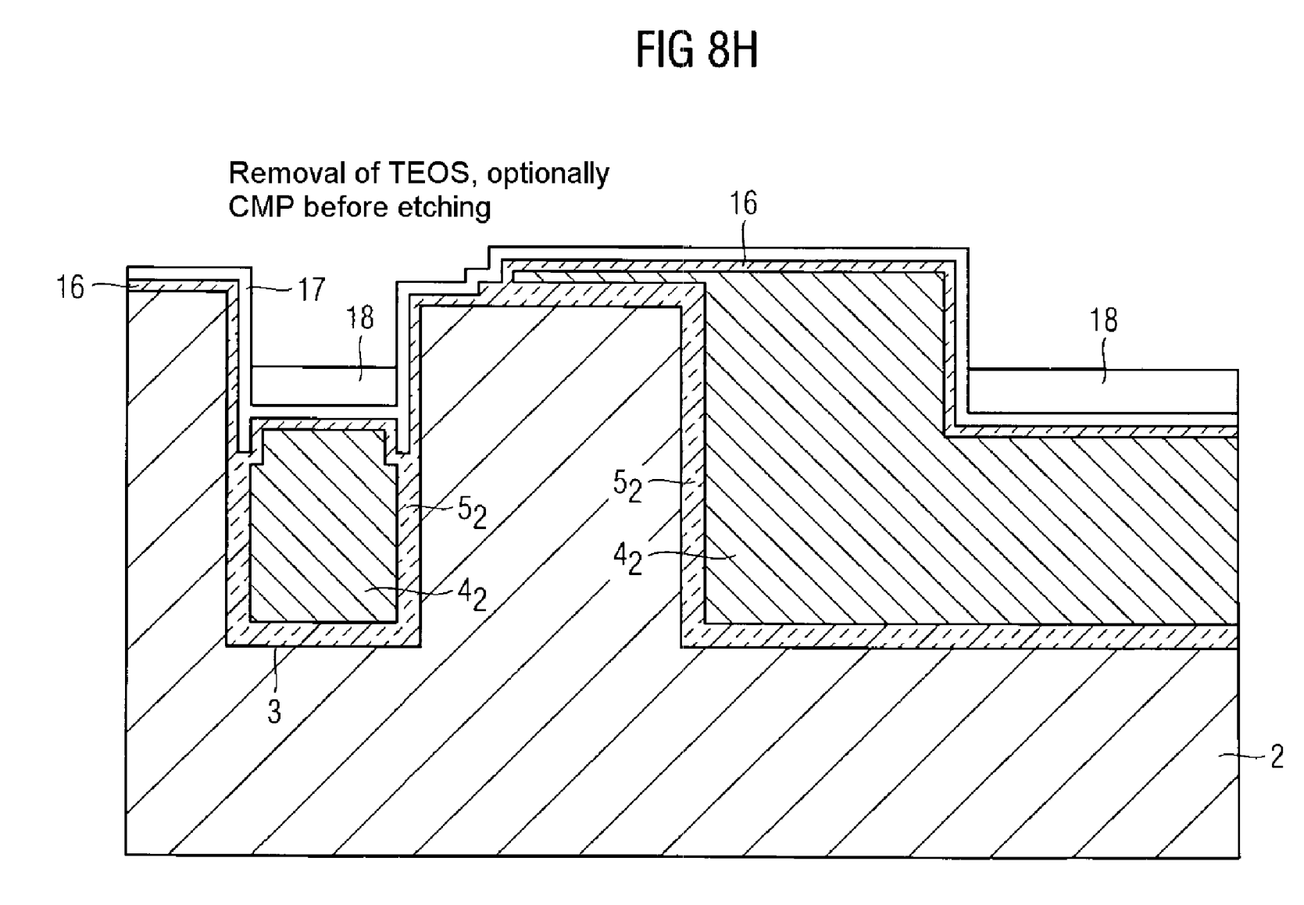
Figure 8I:
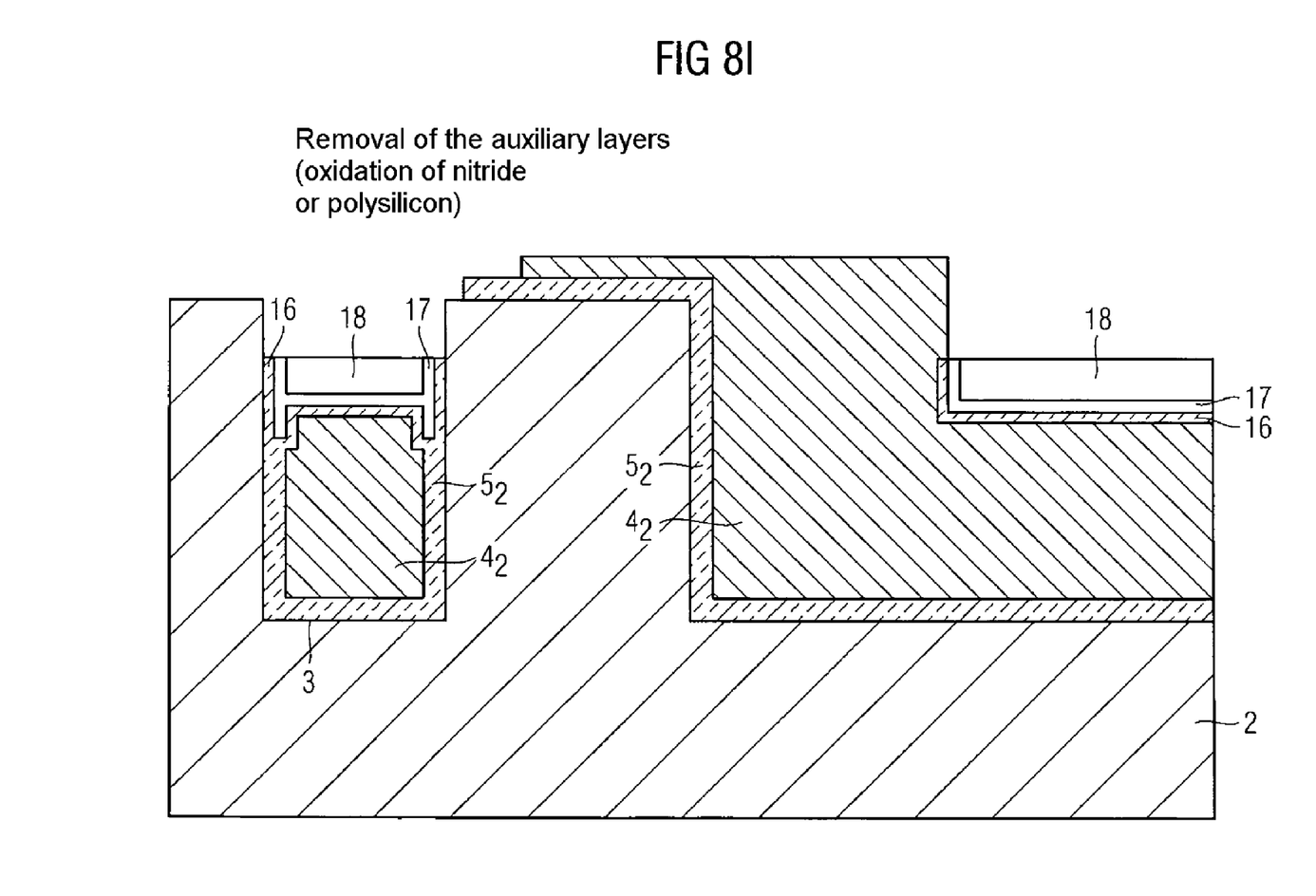
Figure 8J:
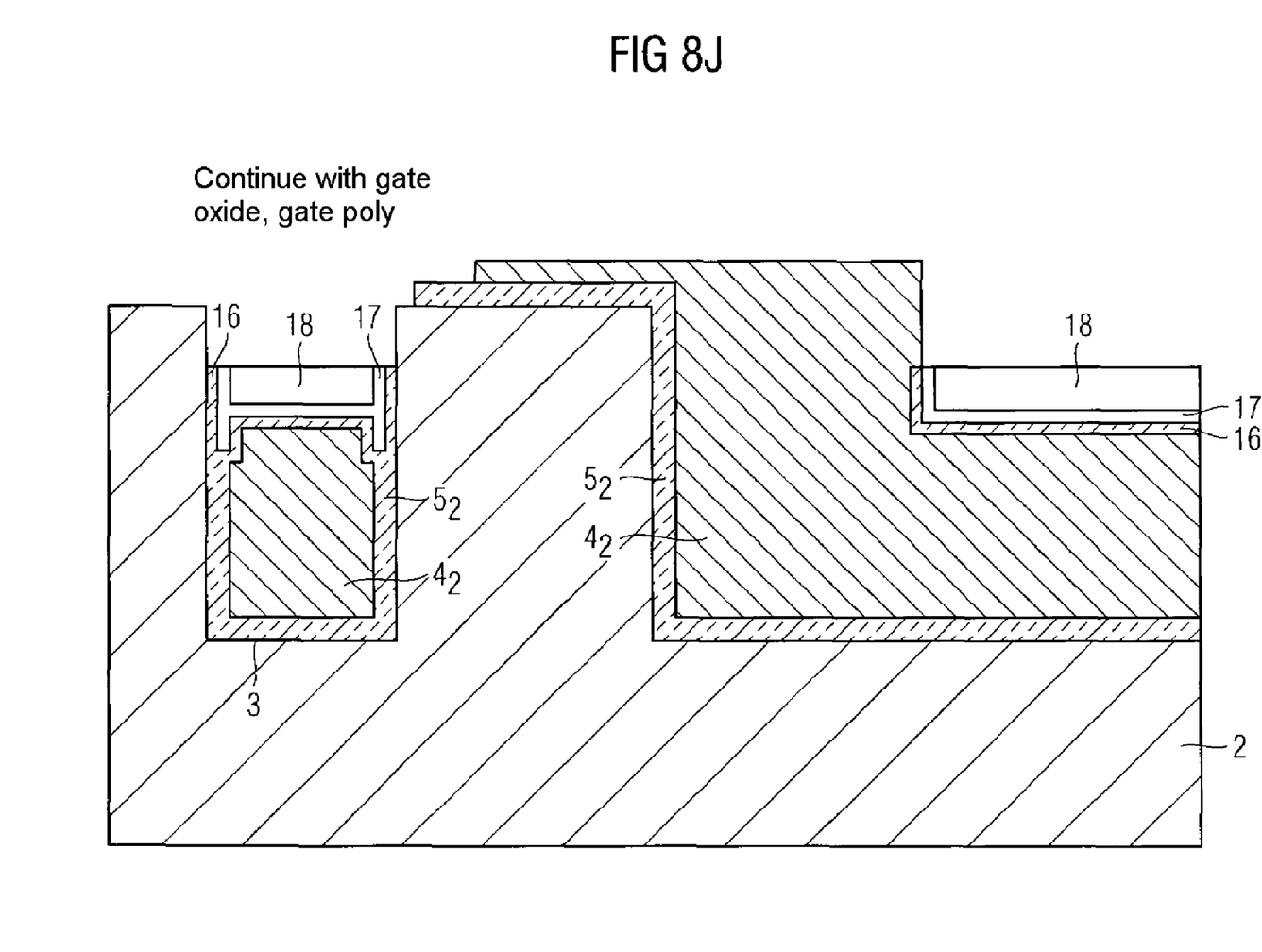

In a first process, a trench structure 3 is introduced into a semiconductor body 2, for example by means of an etching process (FIG. 8A). In a second process (FIG. 8B), a field electrode insulation structure $5_2$ (field plate oxide) is produced on the surface of the semiconductor body 2, for example by means of a thermal oxidation process. In a third process (FIG. 8C), polysilicon is introduced into the trench structure 3 in order to produce a field electrode structure $4_2$. In a fourth process (FIG. 8D), the field electrode insulation structure $4_2$ is etched back into the trench in such a way that the upper ends of the remaining field electrode insulation structure $5_2$ lie below the vertical position of the upper end of the field electrode structure $4_2$. In a fifth process (FIG. 8E), a first insulation layer 16 is applied on the surface of the resulting layer composite. In a sixth process (FIG. 8F), a silicon nitride or polysilicon layer 17 is deposited onto the first auxiliary insulation layer 16. In a seventh process (FIG. 8G), remaining free spaces within the trench structure 3 are filled with TEOS (tetraethyl orthosilicate (deposition oxide)) 18. In an eighth process (FIG. 8H), part of the TEOS material is removed (for example by means of an etching process) in such a way that a residue of the TEOS material 8 remains only within the trench structure 3. In a ninth process (FIG. 8I), the silicon nitride/polysilicon nitride layer 17 and the auxiliary insulation layer 16 are partly removed (above a vertical position corresponding to the vertical position of the top side of the TEOS layer 18). In further process (indicated by FIG. 8J), a gate electrode insulation structure is produced above the layer composite including the auxiliary insulation layer 16, the silicon nitride/polysilicon layer 17 and the TEOS layer 18, and a gate electrode structure is subsequently formed (not illustrated here). Further process required through to the completion of the trench transistor are known to the person skilled in the art.

Further aspects of the invention will be explained in the description below.

In the development of new generations of DMOS power transistors, one important aim is to reduce the on resistivity $R_{on} \cdot A$. In order to achieve this, attempts are made in known trench transistor concepts to reduce the pitch further. This may be effected, on the one hand, by reducing the mesa width between the trenches (dense trench concepts), but on the other hand the trench width itself may be reduced. For higher voltage classes (>40 V), in particular, a reduction of the field oxide thickness is appropriate in the field plate trench concept. The way in which this is achieved without disturbing influences (feedbacks) on the device parameters (switching speeds) is the subject matter of this invention.

One known method for reducing the on resistivity consists in departing from the planar cell structure and using trench cells. As a result, the channel resistance, in particular, is reduced by a significant increase in the channel width per area. The resistance of the drift path (epitaxial resistance) can be reduced by using deep trenches (document U.S. Pat. No. 4,941,026). A field plate trench concept with a gate electrode in the trench is proposed in that case (FIG. 1), but on account of its relatively large overlap with the epitaxial layer and thus the drain zone, said gate electrode has very high gate-drain capacitances, which in turn lead to high switching losses. Therefore, in recent trench transistor generations, besides a gate electrode in the upper trench region, a source electrode in the trench bottom region (FIG. 2) is also used for reducing the gate-drain capacitances (document U.S. Pat. No. 5,998,833). If, on the other hand, the field plate concept is intended to be applied for higher voltage classes of >40 V to typically a few hundred volts, then it is necessary as far as possible to reduce primarily the field oxide thickness ("fox") in the trench bottom region in order both to achieve a lower on resistance by means of the smaller pitch and to ensure the technological feasibility of a thick oxide in the trench bottom. This can be achieved by introducing one or a plurality of auxiliary electrodes (H3) in the trench bottom region, the auxiliary electrodes being put at a suitable varying potential or being at floating potential (DE 103 39 455.9, also see FIG. 3). One disadvantage in this case arises, however, from the fact that such an auxiliary electrode or the voltage supply for such an auxiliary electrode (particularly if it is realized on the chip) has a relatively high internal resistance (Ri) and this results, in the event of rapid switching, in feedback effects of the drain potential via H3 to the gate electrode situated directly above the latter. $Ri_{H3}$ shall hereinafter be the sum of the internal resistances of H3 and the voltage source driving H3. If H3 is floating, then this corresponds to an Ri having infinite magnitude.

In order to avoid/reduce feedback effects to the gate electrodes of field plate transistors, according to the invention a (locally small) source electrode is introduced between the gate electrode in the upper trench region and the auxiliary electrodes in the trench bottom region for shielding purposes. This is illustrated in FIG. 5. For the sake of simpler illustration, here it is the case that there is only ever one auxiliary electrode (H3) illustrated in the trench bottom region. However, it is also possible for a plurality of auxiliary electrodes to be provided, as is illustrated in FIG. 6 (H3, H4, H5 . . . ).

Generally, the gate electrode has a relatively low $Ri_{gate}$, so that, in the case of a rapidly changing drain potential, hardly any positive feedback effects to the gate electrode arise. If, in order to reduce the field oxide thickness in the trench bottom region, use is made of one or a plurality of auxiliary electrodes H3, H4, having very high Ri on account of the small cross section, the low doping or the fact that they are connected via long leads ($Ri_{H3}$ of the auxiliary electrode>>$Ri_{gate}$ of the gate electrode) or owing to the high internal resistance of the voltage source, in the case of the rapidly changing drain potential, this results in strong positive feedback effects to the auxiliary electrodes and, by virtue of the direct proximity of the auxiliary electrodes to the gate electrode, indirectly also to the gate electrode. In the extreme case where the auxiliary electrode is floating, $Ri_{H3}$ is infinite and the auxiliary electrodes follow the drain potential or the potential in the adjacent space charge zone almost simultaneously. As a result, the gate potential is also changed in an undesirable manner.

According to the invention, an additional source electrode is introduced into the region between auxiliary electrode and gate electrode and it then shields the influence of the potentials established in the auxiliary electrodes on the gate electrode. On account of its very low Ri, said source electrode scarcely couples to a rapidly changing drain potential or a potential in the space charge zone and is thus highly suitable for shielding. Furthermore, a particularly thick field oxide is not required in the region of the introduced source electrode since only a fraction of the maximum drain voltage in the off-state case is present there (typically approximately 10% of the reverse voltage).

The invention accordingly introduces a local small source electrode into the region between the gate electrode and one/a plurality of auxiliary electrodes in the trench of a field plate trench transistor for the purpose of shielding from feedback effects.

The shielding electrode at source potential can be used in all trench transistors, in particular in field plate trench transistors (and in this case once again particularly in transistors having one or a plurality of auxiliary electrodes in the trench), the field plates (field electrodes) of which are at a potential U1 between source potential and drain potential or are configured in floating fashion. The width of the shielding electrode is intended essentially to correspond to the width of the gate electrode (very good shielding). The oxide layers between source shielding electrode and adjacent epitaxial layer may turn out to be thin and may even be in the region of the gate oxide thickness since typically only a fraction of the drain voltage is dropped across this region.

In the development of new generations of DMOS power transistors, reducing the gate-to-drain capacitance is of great importance in order to be able to effect faster switching or to be able to use lower-power drivers. In order to achieve a low gate-to-drain capacitance, the intention is to use, in addition to a field electrode at variable potential, a gate electrode that is decoupled as well as possible from the variable field electrode. The field electrode permits a reduction of the field oxide, particularly in the case of higher voltage classes. Instead of one field electrode, it is also possible to use a plurality of field electrodes which lie one above another and which are at different potentials.

What is disadvantageous about known field plate trench transistors is that the thickness of the dielectric which isolates the gate electrode from the field electrode (field plate) is generally coupled with the thickness of the gate oxide on account of the process sequence. Furthermore, on account of the complicated diffusion conditions, weak points or thinned portions may form in said dielectric, which greatly restrict the reliability of the DMOS components.

The invention accordingly provides a structure which realizes a field plate, a gate oxide, a field electrode, a dielectric (or an oxide-metal-oxide sandwich) and a gate electrode with little space requirement in a trench. In this case, the dielectric (or an oxide-metal-oxide sandwich) is realized independently of the gate oxide process, so that its thickness can be set freely and the gate-to-drain capacitance can thus also be reduced. The advantages are a lower gate-to-drain capacitance and an increased reliability.

Therefore, one aspect of the invention consists in making the capacitive coupling between gate electrode and field electrode as small as possible. This can be achieved by increasing the distance between gate electrode and field electrode and/or reducing the relative permittivity of the insulating material between gate electrode and field electrode. The insulating material should be designed as a low-k material, that is to say as a material which preferably has a lower relative permittivity than oxide.

In order to fabricate the insulating material between the gate electrode and the field electrode, it is possible, after the etching of the field plate oxide with the aid of the variable field plate (polysilicon), to protect the channel region of the transistor by means of two layers (an oxide and a polysilicon or nitride). An oxide is then deposited and etched back again. A dielectric thus arises from the three layers, which dielectric isolates the variable field electrode from the gate electrode, and its thickness can be largely freely configured. The aim of reducing the gate-to-drain capacitance is thus achieved. After the etching back, the two auxiliary layers applied first are removed again. The process is subsequently continued in a known manner (gate oxidation and production of the gate poly).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A trench transistor, having a semiconductor body, comprising:
    a trench structure; and
    an electrode structure embedded in the trench structure;
    wherein the electrode structure is electrically insulated from the semiconductor body by an insulation structure and has a gate electrode structure and a field electrode structure arranged below the gate electrode structure and electrically insulated from the latter;
    wherein there is provided between the gate electrode structure and the field electrode structure a shielding structure for reducing the capacitive coupling between the gate electrode structure and the field electrode structure; and
    wherein the sum of the internal resistances of the shielding electrode and the current/voltage supply of the shielding electrode is less than corresponding internal resistance sums for the gate electrode structure and the field electrode structure.

2. The trench transistor as claimed in claim 1, wherein the shielding structure is a shielding electrode which is at a fixed potential and which is electrically insulated from the gate electrode structure, the field electrode structure and the semiconductor body.

3. The trench transistor as claimed in claim 2, wherein the shielding electrode is at source potential.

4. The trench transistor as claimed in claim 1, wherein the shielding structure is realized by a shielding insulation layer, the thickness of which is greater than the thickness of the insulation structure region which insulates the field electrode structure from the semiconductor body.

5. The trench transistor as claimed in claim 4, wherein the thickness of the shielding insulation layer is greater than double the thickness of the insulation structure region which insulates the gate electrode structure from the semiconductor body, or greater than double the thickness of the insulation structure region which insulates the field electrode structure from the semiconductor body.

6. The trench transistor as claimed in claim 4, wherein the shielding insulation layer is a layer sequence comprising a first oxide layer, a nitride layer and a second oxide layer.

7. The trench transistor as claimed in claim 1, wherein the shielding structure has a shielding insulation layer, the k value of which is less than the k value of the insulation structure.

8. The trench transistor as claimed in claim 1, wherein the shielding structure is a cavity.

9. The trench transistor as claimed in claim 1, wherein the horizontal distances between the shielding structure and the semiconductor body are less than the horizontal distances between the gate electrode structure and the semiconductor body.

10. A trench transistor, having a semiconductor body, comprising:
   a trench structure;
   an electrode structure embedded in the trench structure;
   the electrode structure being electrically insulated from the semiconductor body by an insulation structure and having a gate electrode structure and a field electrode structure arranged below the gate electrode structure and electrically insulated from the latter; and
   there being provided between the gate electrode structure and the field electrode structure a shielding structure for reducing the capacitive coupling between the gate electrode structure and the field electrode structure, wherein the sum of the internal resistances of the shielding structure and of the current and/or voltage supply thereof is less than the sum of the internal resistances of the gate electrode structure and of the current and/or voltage supply thereof and/or is less than the sum of the internal resistances of the field electrode structure and of the current and/or voltage supply thereof.

11. A semiconductor device comprising:
   a semiconductor body;
   a trench structure in the semiconductor body;
   an electrode structure in the trench structure;
   insulation means for insulating the electrode structure from the semiconductor body;
   a field electrode structure below the electrode structure and insulated therefrom;
   means for reducing capacitive coupling between the gate and field electrode structures; and
   a shielding electrode, wherein the sum of the internal resistances of the shielding electrode and the current/voltage supply of the shielding electrode is less than corresponding internal resistance sums for the electrode structure and the field electrode structure.

12. The semiconductor device of claim 11, further comprising a shielding structure.

13. The semiconductor device of claim 12, wherein the shielding structure is between the gate and field electrode structures.

14. The trench transistor as claimed in claim 12, wherein the shielding structure is a shielding electrode which is at a fixed potential and which is electrically insulated from the gate electrode structure, the field electrode structure and the semiconductor body.

15. The trench transistor as claimed in claim 12, wherein the shielding electrode is at source potential.

* * * * *